United States Patent
Felici

(10) Patent No.: US 11,867,723 B2
(45) Date of Patent: Jan. 9, 2024

(54) VERTICAL PROBE HEAD HAVING AN IMPROVED CONTACT WITH A DEVICE UNDER TEST

(71) Applicant: Technoprobe S.p.A., Cernusco Lombardone (IT)

(72) Inventor: Stefano Felici, San Jose, CA (US)

(73) Assignee: Technoprobe S.p.A., Cernusco Lombardone (IT)

(*) Notice: Subject to any disclaimer, the term of this patent is extended or adjusted under 35 U.S.C. 154(b) by 386 days.

(21) Appl. No.: 17/357,833

(22) Filed: Jun. 24, 2021

(65) Prior Publication Data
US 2021/0318355 A1    Oct. 14, 2021

Related U.S. Application Data

(63) Continuation-in-part of application No. PCT/EP2019/085709, filed on Dec. 17, 2019.

(30) Foreign Application Priority Data

Dec. 27, 2018 (IT) .................... 102018000021253

(51) Int. Cl.
*G01R 1/073* (2006.01)

(52) U.S. Cl.
CPC ............................. *G01R 1/07371* (2013.01)

(58) Field of Classification Search
CPC ............ G01R 1/07371; G01R 1/07357; G01R 1/06733; G01R 1/07314
USPC ................... 324/750.25, 750.16, 537, 500
See application file for complete search history.

(56) References Cited

U.S. PATENT DOCUMENTS

| 7,180,318 | B1 | 2/2007 | Mahoney et al. |
| 2001/0011897 | A1 | 8/2001 | Hamel et al. |
| 2003/0151419 | A1* | 8/2003 | Felici ............... G01R 1/07342 324/755.07 |
| 2005/0270044 | A1* | 12/2005 | Crippa ............. G01R 1/07357 324/755.11 |
| 2018/0003767 | A1 | 1/2018 | Crippa et al. |
| 2019/0361051 | A1* | 11/2019 | Vettori .............. G01R 1/07371 |

FOREIGN PATENT DOCUMENTS

| EP | 0 164 672 A2 | 12/1985 |
| JP | 2008-139034 A | 6/2008 |

OTHER PUBLICATIONS

International Search Report, dated Mar. 9, 2020, for International Application No. PCT/EP2019/085709, 4 pages.

* cited by examiner

*Primary Examiner* — Giovanni Astacio-Oquendo
(74) *Attorney, Agent, or Firm* — Seed IP Law Group LLP

(57) ABSTRACT

A probe head for testing a device under test integrated on a semiconductor wafer includes a plurality of contact probes, each having a first end and a second end, and at least one first lower guide and one second lower guide at the first end. The guides are parallel to each other and have a respective plurality of first and second guide holes for slidingly housing the contact probes. At least one third lower guide is substantially parallel to the first lower guide and to the second lower guide and includes a plurality of third guide holes for slidingly housing the contact probes. The guide holes are disposed in a shifted arrangement to eliminate a scrub movement of the first ends of each contact probe of the probe head.

10 Claims, 3 Drawing Sheets

VERTICAL PROBE HEAD HAVING AN IMPROVED CONTACT WITH A DEVICE UNDER TEST

BACKGROUND

Technical Field

The present disclosure relates to a probe head comprising a plurality of vertical probes for testing devices integrated on a semiconductor wafer, and the following description is made with reference to this application field with the only purpose of simplifying the exposition thereof.

Description of the Related Art

As it is well known, a probe head is an electronic device adapted to electrically connect a plurality of contact pads of a microstructure, such as an integrated device, with corresponding channels of a testing apparatus that performs the functionality testing thereof, in particular electric, or generically the test.

The test, which is performed on integrated devices, is particularly useful for detecting and isolating defective circuits as early as in the production phase. Normally, probe heads are therefore used for the electric test of devices that are integrated on wafers before cutting and assembling them inside a containment package.

A probe head essentially comprises a plurality of movable contact elements or contact probes retained by at least one pair of supports or guides that are substantially plate-shaped and parallel to each other. Said guides are provided with suitable guide holes and are arranged at a certain distance from each other in order to leave a free area or air gap for the movement and possible deformation of the contact probes, which are slidingly housed in said guide holes. The pair of guides comprises in particular an upper guide and a lower guide, both provided with guide holes within which the contact probes axially slide, said probes being usually made of wires of special alloys with good electric and mechanical properties.

The proper connection between the contact probes and the contact pads of the device under test is ensured by the pressure of the probe head on the device itself, wherein the contact probes undergo, during said pressing contact, a bending inside the air gap between the guides and a sliding inside the respective guide holes. Probe heads of this type are commonly called as "vertical probe heads."

Substantially, the vertical probe heads have an air gap in which a bending of the contact probes occurs, wherein said bending can be helped by a suitable configuration of the probes themselves or of the guides thereof, as schematically illustrated in FIG. 1.

In particular, FIG. 1 schematically illustrates a probe head 1 comprising at least one plate-shaped upper support or guide 2, usually indicated as "upper die," and one plate-shaped lower support or guide 3, usually indicated as "lower die," having respectively guide holes 4 and 5 within which a plurality of contact probes 6 slides.

Each contact probe 6 ends at an end thereof with a contact tip 7 intended to abut onto a contact pad 8 of a device under test integrated on a wafer 9, so as to realize the mechanical and electric contact between said device under test and a testing apparatus (not shown), which said probe head forms a terminal element of.

Herein and hereinafter the term "contact tip" indicates an end area or region of a contact probe intended to contact a contact pad, said end area or region being not necessarily pointed.

In some cases, the contact probes are fixedly fastened to the probe head itself at the upper plate-shaped support: such probe heads are referred to as "blocked probe heads."

However, more frequently, probe heads comprises not fixedly fastened probes, but interfaced to a so-called board, possibly through a microcontact board provided with a plurality of contact pads: such probe heads are referred to as "unblocked probe heads." The microcontact board is usually called "space transformer" since, besides contacting the probes, it also allows spatially redistributing the contact pads realized thereon with respect to the contact pads on the device under test, in particular relaxing the distance constraints between the centers (pitch) of the pads themselves.

In this case, as illustrated in FIG. 1, each contact probe 6 has a further end area or region ending with a so-called contact head 7A towards a contact pad 8A of a plurality of contact pads of a space transformer 9A. The proper electric connection between probes 6 and space transformer 9A is ensured by the pressure abutment of the contact heads 7A of the contact probes 6 onto the contact pads 8A of the space transformer 9A analogously to the contact between the contact tips 7 with the contact pads 8 of the device under test integrated on the wafer 9.

As indicated in FIG. 1, the upper guide 2 and the lower guide 3 are suitably spaced apart by an air gap 10 which allows the contact probes 6 to deform. Finally, the guide holes 4 and 5 are sized so as to allow the contact probe 6 to slide therein.

The correct operation of a vertical probe head of the described type is basically linked to two parameters: the vertical movement, or overtravel, of the contact probes and the horizontal movement, or scrub, of the contact tips of said contact probes on the contact pads of the device under test. It is notoriously important to ensure the scrub of the contact tips so as to allow superficially scratching the contact pads, in particular of the device under test, removing the impurities formed thereon for instance in the form of a thin layer or film of oxide or other accumulated dirt, thus improving the contact performed by the probe head by means of its probes.

All these features should be evaluated and calibrated in the manufacturing step of a probe head, since the proper electric connection between probes and device under test should always be ensured.

According to a known methodology, the contact probes 6 are initially made straight, with a constant cross-section along their entire length, in case rectangular, and generally thinned and possibly pointed at the ends to form the contact ends, in particular the contact tip 7 and the contact head 7A respectively, as illustrated in FIG. 1. Successively, the probe head is formed by overlapping the upper guide 2 and the lower guide 3 in order to match the respective guide holes, namely by aligning the respective centers according to a direction orthogonal to the guides, inserting the contact probes 6 into said guide holes, spacing the upper guide 2 from the lower guide 3 to form the air gap 10 and then shifting said guides, thus causing a deformation of the body of the contact probes 6, in a substantially central position, as illustrated in FIG. 1. In this case the probe heads are referred to as probe heads with shifted plates and the contact probes 6 are also indicated as "buckling beam."

Furthermore, the relative shift of the upper guide 2 and of the lower guide 3 determines the deformation direction of the contact probe 6 and thus the movement direction of the respective contact tip 7 on the contact pad 8 of the device under test integrated on a wafer 9, which is indicated as scrub direction Dscrub in FIG. 1.

It is also possible to use probes which are already pre-deformed, the shift between the guides accentuating in this case said pre-deformation.

It is also known that, for a vertical probe head having shifted plates, such as the one illustrated in FIG. 1, when the contact tips 7 of the contact probes 6 contact the contact pads 8 of the device under test integrated on the wafer 9, the deformation of the probes 6 causes a bending that is substantially identical for all said probes 6, so that each contact tip 7 exerts a scrub in the direction Dscrub on the contact pads 8, as indicated by the arrow in FIG. 1.

Furthermore, according to a solution known in the field and illustrated in FIG. 2, the probe head 1 comprises a pair of lower guides 3' and 3" and a pair of upper guides 2' and 2" provided with respective pluralities of guide holes for slidingly housing a plurality of contact probes (for simplicity of illustration, only a contact probe 6 is represented in FIG. 2). In particular, the guide holes of the lower guides 3' and 3" are suitably shifted with respect to each other to avoid jamming of the contact probes 6 in the guide holes themselves, as well as to control the scrub of the contact tips 7. A similar shift may also be provided between the guide holes of the upper guides 2' and 2".

However, the simultaneous scrub mechanism of all of the contact tips 7 of the plurality of contact probes 6 of the probe head 1 on the contact pads 8 of the device under test generates a shear force on the wafer 9, which comprises a plurality of devices under test; in particular, this shear force is a force acting in the direction Dscrub and is equal to the sum of the forces generated by all probes 6 (all acting in the same direction Dscrub) on all contact pads 8, so that said shear force on the wafer 9 may reach high values. In particular, shear force indicates herein a force that is substantially parallel to the wafer 9, which defines a plane that is substantially parallel to the one in which the guides of the probe head 1 lie, the force being applied at a face thereof facing the probe head 1, which is the face on which the contact pads 8 are formed and onto which the contact tips 7 of the contact probes 6 abut.

Since the probe heads usually comprise thousands of probes, the shear force due to the scrub of all of the contact probes abutting onto the contact pads of the devices under test may be such as to cause a considerable lateral shift of the wafer 9 when the probe head (in particular the contact probes thereof) exerts a pressing contact thereon. This problem is also particularly important in case of testing single dies, which obviously do not have the resistance and inertia of an entire wafer.

For this reason, there is a need today to reduce this undesired lateral shift in order to improve the test performed by the vertical probe heads.

It is thus desirable to provide a probe head having structural and functional features such as to allow overcoming the limitations and drawbacks still affecting the probe heads according to the prior art, in particular able to reduce, in a simple and effective manner, the shear force exerted on the wafer by the contact probes during the pressing contact occurring during the test of devices integrated on said wafer, possibly in the form of a single die.

BRIEF SUMMARY

Embodiments of the present disclosure provide a vertical probe head provided with guides configured such that the scrub of each contact probe is substantially null. In particular, a pair of lower guides is provided, said guides having guide holes shifted with respect to each other, as well as a further lower guide whose guide holes have a suitably calibrated shift with respect to the shift between the guide holes of the other two lower guides, in order to cancel each scrub movement, so that the shear forces exerted by the contact probes are entirely absorbed by said further lower guide, resulting in a null force exerted by each single contact probe onto the wafer and therefore an overall null shear force.

More in particular, an exemplary probe head for testing a device under test integrated on a semiconductor wafer comprises a plurality of contact probes, each provided with a first end and with a second end, said first end being adapted to contact pads of a device under test, and at least one first lower guide and one second lower guide at the first end, said guides being parallel to each other and provided with a respective plurality of first and second guide holes for slidingly housing the contact probes, wherein the second guide holes of the second lower guide are shifted with respect to the first guide holes of the first lower guide along a first direction, said probe head being characterized in that it comprises at least one third lower guide, which is substantially parallel to the first lower guide and to the second lower guide and is provided with a plurality of third guide holes for slidingly housing the contact probes, wherein the second lower guide is arranged between the first lower guide and the third lower guide, and wherein the third guide holes of the third lower guide are shifted with respect to the second guide holes of the second lower guide along a second direction opposite the first direction, the shift of said third guide holes being such as to eliminate the scrub movement of the first ends of each contact probe of the probe head.

More particularly, the disclosure comprises the following additional and optional features, taken alone or in combination if necessary or desired.

According to an aspect of the present disclosure, the shift along the first direction of the second guide holes with respect to the first guide holes may be substantially equal to 5-30 μm, and the shift along the second direction of the third guide holes with respect to the second guide holes may be substantially equal to 5-30 μm.

According to an aspect of the present disclosure, the probe head may comprise at least one first upper guide, which is arranged at the second end of the contact probes and is parallel to the lower guides, said first upper guide being provided with a plurality of guide holes for slidingly housing the contact probes.

According to an aspect of the present disclosure, the probe head may further comprise a second upper guide associated with the first upper guide, said second upper guide comprising guide holes that are shifted with respect to the guide holes of the first upper guide.

According to another aspect of the present disclosure, each contact probe may comprise a body extending along a longitudinal axis between the first end and the second end.

Furthermore, the first end of all of the contact probes may be shifted, with reference to the longitudinal axis, with respect to the second end according to a specific direction.

In particular, the upper guides and the lower guides may be mutually shifted so as cause the above-mentioned shift between the first end and the second end of the contact probes.

According to another aspect of the present disclosure, at least one wall of the contact probes may be adapted to contact a corresponding wall of the third guide holes of the third lower guide, which is configured to counteract the transversal force exerted by said contact probes.

Finally, the third lower guide may be arranged so as to be the closest guide to the device under test during the test thereof.

Embodiments of the present disclosure also refers to a probe card for a testing equipment of electronic devices, comprising at least one probe head made as above indicated, a space transformer adapted to perform a spatial transformation of the distances between contact pads made on a face thereof facing the probe head and/or a printed circuit board adapted to interface said probe card with the test equipment.

The characteristics and advantages of the probe head according to the disclosure will be apparent from the description, made hereinafter, of an embodiment thereof, given by way of indicative and non-limiting example, with reference to the enclosed drawings.

DETAILED DESCRIPTION

Figure 1:
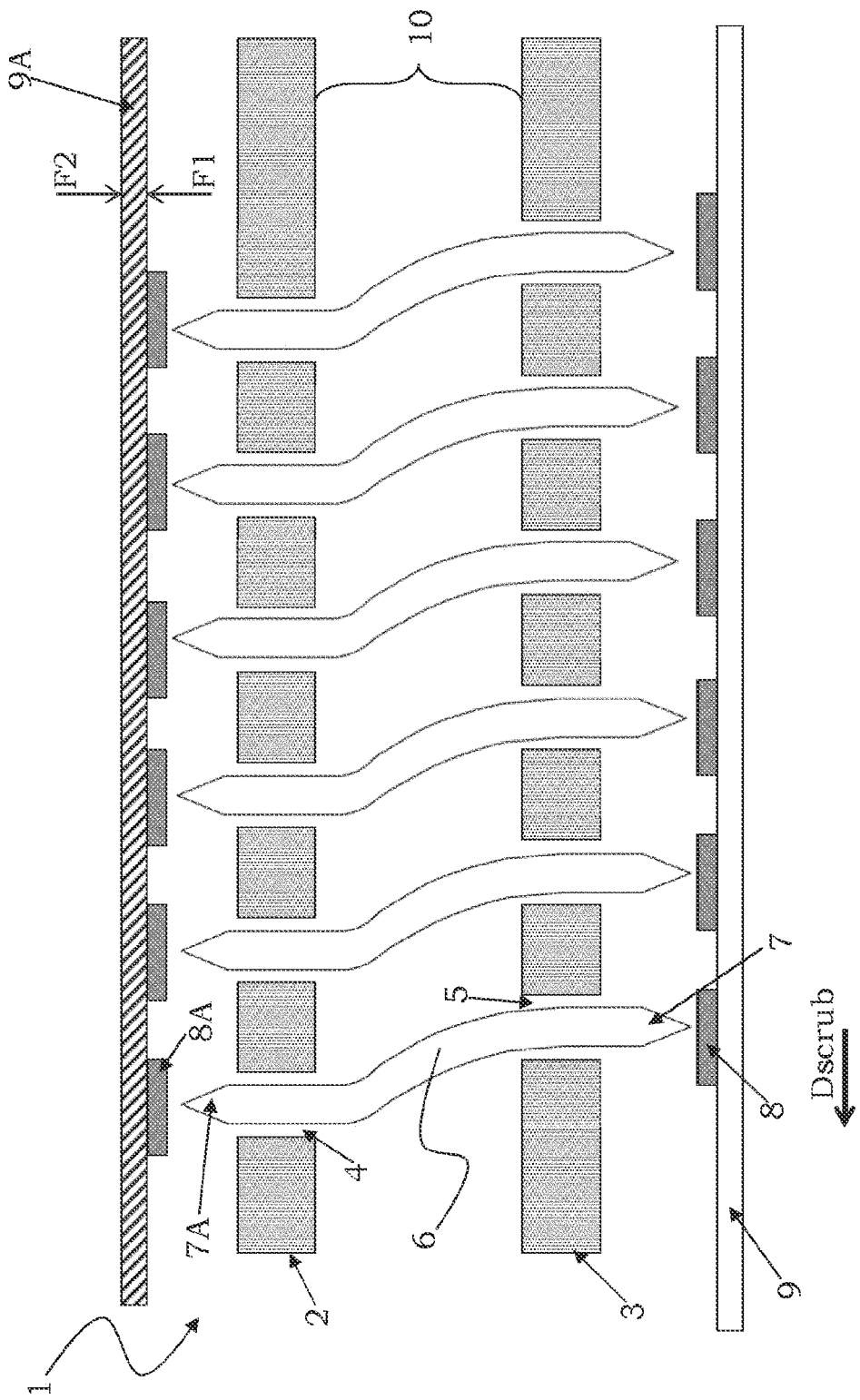
FIG. 1 schematically shows a probe head according to the prior art.
Figure 2:
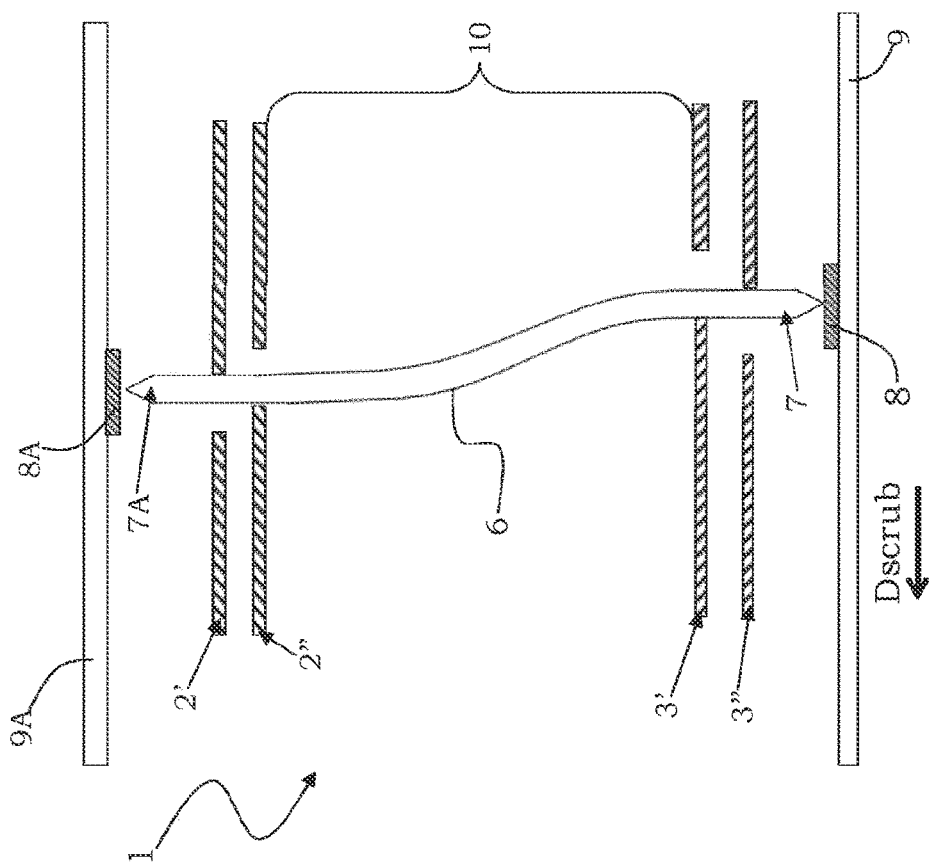
FIG. 2 schematically shows an alternative embodiment of the probe head according to the prior art.
Figure 3:
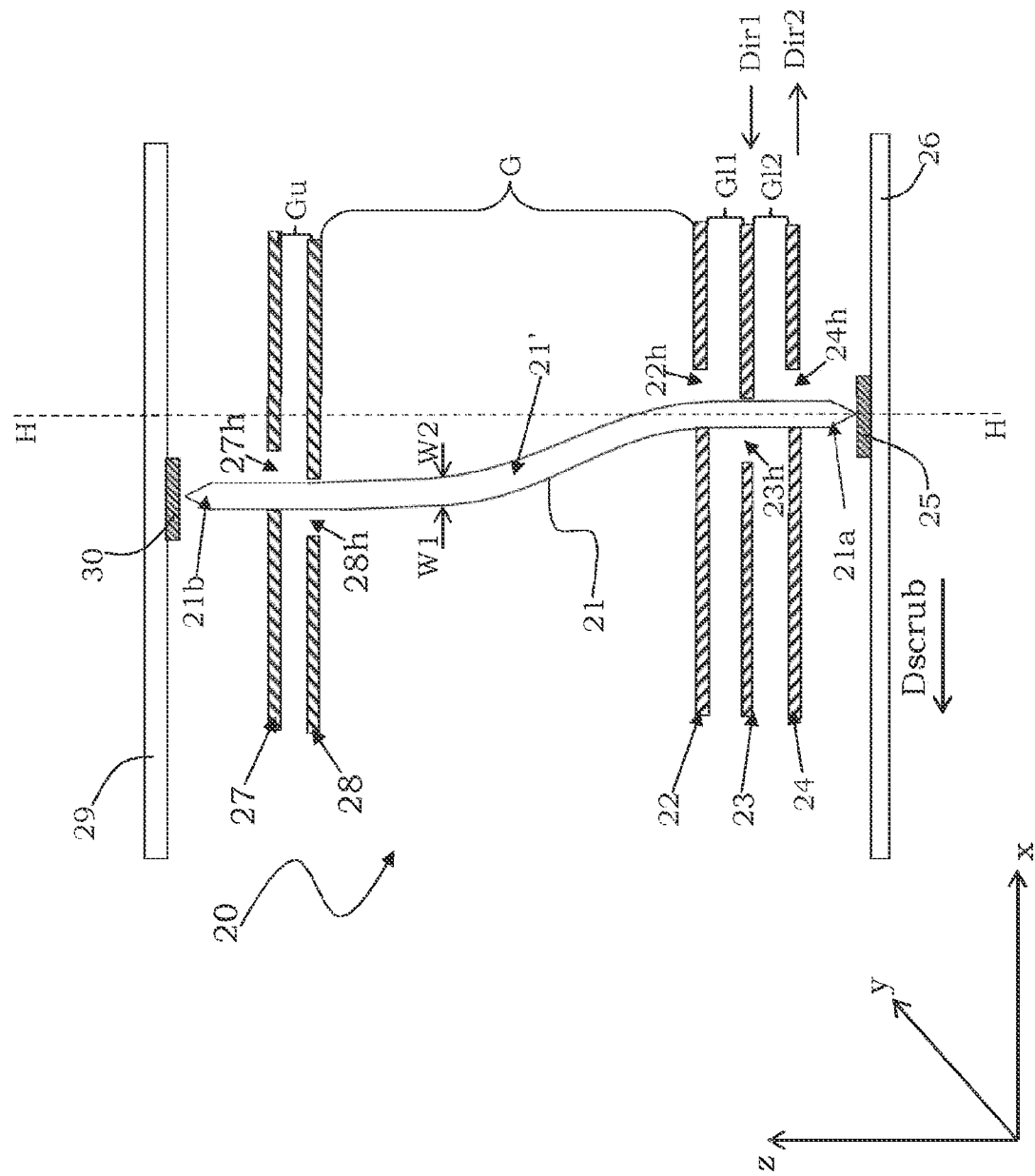
FIG. 3 schematically shows a probe head according to the present disclosure.

With reference to those figures, and in particular to FIG. 3, a vertical probe head for testing electronic devices integrated on a semiconductor wafer according to the present disclosure is globally and schematically indicated with 20.

It is worth noting that the figures represent schematic views and are not drawn to scale, but instead they are drawn so as to emphasize the important features of the disclosure. Moreover, in the figures, the different elements are depicted in a schematic manner, their shape varying depending on the application desired. It is also noted that in the figures the same reference numbers refer to elements that are identical in shape or function. Finally, particular features described in relation to an embodiment illustrated in a figure are also applicable to the other embodiments illustrated in the other figures.

The probe head 20 of the present disclosure comprises a plurality of contact probes 21, each probe being provided with a preferably rod-shaped body 21' extending along a longitudinal axis H-H between a first end 21a and a second end 21b, said body 21' being deformed as shown hereinafter in greater detail.

For simplicity of illustration, in FIG. 3 only one contact probe is represented, the figures being given only by way of indicative and non-limiting example, and the number of contact probes may obviously vary according to the requirements and circumstances.

The first end 21a is adapted to contact pads 25 of a device under test integrated on a semiconductor wafer 26 and is also indicated in the field as "contact tip," whereas the second end 21b (indicated in the field also as "contact head") may be adapted to contact pads of a space transformer or of a printed circuit board (PCB), as well as it may also be welded to an upper support, as it will be illustrated hereinafter. It is noted that the ends 21a and 21b are not necessarily pointed, and their shape may vary according to the requirements and/or circumstances.

It is further noted that the longitudinal axis H-H of the contact probes 21 substantially extends in the direction indicated by axis z (vertical axis) of the reference system of FIG. 3.

The probe head 20 comprises a first lower guide 22 and a second lower guide 23 arranged at the first end 21a of the contact probes 21. The lower guides 22 and 23 are parallel to each other and spaced apart by a first lower air gap Gl1. Each of the lower guides 22 and 23 is provided with a respective plurality of first and second guide holes 22h and 23h for slidingly housing the contact probes 21, wherein the second guide holes 23h of the second lower guide 23 are shifted with respect to the first guide holes 22h of the first lower guide 22 along a first shift direction, herein indicated as first direction Dir1. In the example of FIG. 3, the first direction Dir1 faces (corresponds to) the negative direction of axis x.

The first lower guide 22 and the second lower guide 23 are substantially plate-shaped supports that are parallel to each other and may have any suitable shape (for instance rectangular or squared) wherein the longitudinal axes extend in a plane identified by axes x and y (horizontal axes) of the reference system of FIG. 3 and orthogonally to the longitudinal axis H-H of the contact probes 21.

In a preferred embodiment of the present disclosure, illustrated in FIG. 3, the probe head 20 also comprises a first upper guide 27, which is arranged at the second end 21b of the contact probes 21 and is substantially parallel to the first lower guide 22 and to the second lower guide 23, said first upper guide 27 being provided with a plurality of guide holes 27h for slidingly housing the contact probes 21.

Still more preferably, the probe head 20 further comprises a second upper guide 28 associated with the first upper guide 27 and separated therefrom by an upper air gap Gu.

It is noted that, in the context of the present disclosure, the term "associated" indicates that a guide is arranged close to another guide (upper or lower) and forms together with it a set of guides (upper or lower) that are substantially parallel to each other. In other words, once a guide is associated with an upper or lower guide, a pair of upper or lower guides intended to house the contact probes is formed.

The first upper guide 27 is thus separated from the second upper guide 28 by the upper air gap Gu, the second upper guide 28 is separated from the lower guides, in particular from the first lower guide 22, by an air gap G having greater extension than the upper air gap Gu, whereas, as above indicated, the first lower guide 22 is separated from the second lower guide 23 by the first lower air gap Gl1.

The upper and lower guides are arranged with respect to each other (in particular shifted) so that the first end 21a of each contact probe 21 is shifted, with reference to the longitudinal axis H-H, from the second end 21b, namely such that the contact probes 21, which are preferably made straight, have a deformation of the body 21'. It is however possible for the contact probes 21 to have an initial pre-deformation, so that the shift of the guides accentuates said pre-deformation. In particular, the shift of the upper and lower guides is related with the shift of the guide holes thereof.

The second upper guide 28 comprises guide holes 28h that are shifted with respect to the guide holes 27h of the first upper guide 27. The shift of the guide holes of the upper guides 27 and 28 allows controlling more precisely the further deformation which the contact probes 21 are subjected to during the pressing contact with the device under test, avoiding the contact between contact probes that are close to each other.

It is noted that, although the embodiment in which the probe head 20 comprises one or two upper guides is preferred, other solutions are possible. By way of example, in an embodiment not illustrated in the figures, the second end 21b of the contact probes 21 may be welded to a support associated with the probe head 20. In this case, the shift between the ends of the probes is obtained thanks to the proper shift of the guide holes of the lower guides with respect to the longitudinal axis H-H of the probes.

In any case, the shift of the upper and lower guides, namely of the guide holes thereof, and thus of the ends 21a and 21b of the contact probes 21, determines the desired deformation direction of said contact probes 21 and thus the movement direction of the respective contact tips 21a onto the contact pads 25 of the device under test integrated on the wafer 26, said direction being indicated as scrub direction Dscrub in FIG. 3. In the non-limiting example of FIG. 3, the scrub direction Dscrub faces the negative direction of axis x, as it occurs for the first direction Dir1.

The above mentioned shift of the second guide holes 23h of the second lower guide 23 with respect to the first guide holes 22h of the first lower guide 22 allows controlling the scrub of the first ends 21a of the contact probes 21.

However, as above noted, said scrub movement determines an overall shear force (transversal force) on the semiconductor wafer 26 that may reach excessive values and cause undesired effects, such as a shift of the wafer itself. For this reason, advantageously according to embodiments of the present disclosure, the probe head 20 comprises at least one third lower guide 24, which is substantially parallel to the first lower guide 22 and to the second lower guide 23 and is provided with a plurality of third guide holes 24h for slidingly housing the contact probes 21.

More particularly, the second lower guide 23 is arranged between the first lower guide 22 and the third lower guide 24; in other words, the third lower guide 24 is the guide that, during the contact of the probe head 20 with the contact pads 25 of the device under test, is closer to the latter. The third lower guide 24 is separated from the second lower guide 23 by a second lower air gap Gl2.

The third lower guide 24 is substantially a plate-shaped support that is parallel to the guides 22 and 23 and may have any shape analogous to the shape of said guides 22 and 23.

Suitably, the third guide holes 24h of the third lower guide 24 are shifted with respect to the second guide holes 23h of the second lower guide 23 along a second direction opposite the first direction Dir1, said second direction being herein indicated as Dir2 and being represented by the arrow facing the positive direction of axis x in FIG. 3.

In this way, it is possible to choose the shift of the third guide holes 24h so as to eliminate the scrub movement of the first ends 21a of each contact probe 21 of the probe head 20, thus solving the above problem due to the lateral or shear forces exerted by said probes during the scrub. In particular, the shift of the third guide holes 24h with respect to the second guide holes 23h is substantially of the same entity (and opposite direction) as of the shift of said second guide holes 23h with respect to the first guide holes 22h.

The third lower guide 24 is thus adapted to block the scrub movement of the first ends 21a of each contact probe 21, the lateral force exerted by the single probes being unloaded on said third lower guide 24.

Specifically, a first wall W1 of the contact probes 21 is adapted to contact a corresponding first wall of the third guide holes 24h of the third lower guide 24, which is thus configured to counteract the transversal force exerted by said probes, said first wall exerting an opposite reaction force (namely, opposite the scrub direction Dscrub).

The contact probes 21 are adapted to bend during the pressing contact with the contact pads 25 of the device under test and, in the absence of the third lower guide 24, there would be a scrub movement of the first ends 21a of the contact probes 21.

By way of non-limiting example, in the rest conditions, a second wall W2, opposite the first wall W1, of the contact probe 21 is in contact with a corresponding second wall of a second guide hole 23h made in the second lower guide 23, wherein between the first wall W1 of the contact probe 21 and a first wall of the second guide hole 23h, opposite the second wall in contact with the second wall W2 of the probe, a clearance is defined whose width is determined by the dimensions of the guide holes 23h of the lower guide 23 with respect to a diameter of the contact probe 21, the term diameter indicating herein and in the following the maximum transversal dimension, also in case of probes having non-circular section. During the contact with the device under test, following the scrub movement of the first end 21a, the first wall W1 of the contact probe 21 would contact the first wall of the second guide hole 23h.

It is pointed out that the first wall W1 of the contact probe 21 (as well as the first wall of the holes) is a wall that follows the longitudinal axis H-H of the probe itself with respect to the scrub direction Dscrub, whereas the second wall W2 of the contact probe 21 (as well as the second wall of the holes) is a wall that precedes said longitudinal axis H-H according to the scrub direction Dscrub.

A similar argument can be made for the first guide holes 22h: in the rest conditions, the first wall W1 is in contact with a corresponding first wall of the first guide hole 22h, wherein between the second wall W2 and a second wall of the first guide hole 22h, opposite the first wall in contact with the first wall W1 of the probe, a clearance is defined. During the contact with the device under test, following the scrub movement of the first end 21a, the second wall W2 of the contact probe 21 would contact the second wall of the first guide hole 22h.

In this case, there would be a scrub of the contact tips 21a, said scrub being controlled through the relative shift between the second guide holes 23h and the first guide holes 22h. The third lower guide 24 is thus introduced in order to block, through the walls of the third guide holes 24h, said scrub movement, without limiting the bending of the contact probes 21 during the contact with the device under test.

It is further noted that a clearance is always present between the walls of the probes and the walls of the holes of the guides.

Furthermore, the shift along the first direction Dir1 of the second guide holes 23h with respect to the first guide holes 22h is substantially equal to 5-30 µm, and the shift along the second direction Dir2 of the third guide holes 24h with respect to the second guide holes 23h is also substantially equal to 5-30 µm.

The guide holes are thus mutually shifted along a longitudinal axis of the guides, which is substantially orthogonal to the longitudinal axis H-H of the probes and parallel for instance to axis x (horizontal axis) of the reference system of FIG. 3, said longitudinal axis H-H being substantially orthogonal to the guides.

This configuration thus assures that no shear force parallel to a face of the semiconductor wafer 26 facing the probe head 20 is exerted by the probes. Suitably, this advantage of the probe head 20 according to embodiments of the present disclosure is obtained along with the possibility not to modify the pitch of the guide holes and thus of the contact probes.

Still referring to FIG. 3, as previously indicated, the probe head 20 is preferably of the type having non-fastened vertical probes and the second end 21b of the contact probes 21 is adapted to abut onto contact pads 30 of an interposer or space transformer 29.

In particular, the space transformer 29 is adapted to perform a spatial transformation of the distances between the centers or pitches of the contact pads formed on opposite faces thereof. Still more particularly, on a first face of the space transformer 29 facing the probe head 20, the contact pads 30 may have, between each other, a pitch equal to that of the contact pads 25 of the device under test, whereas the contact pads (not illustrated) formed on a second and opposite face of the space transformer 29 have a pitch equal to that of contact pads formed on a printed circuit board or PCB (also not illustrated) which is generally connected to said space transformer 29, in particular they have a pitch greater than the pitch of the contact pads 30, performing in this way the desired spatial transformation and allowing a simpler arrangement of the contact pads on said second and opposite face and a simpler connection with the PCB and thus with the testing apparatus. Therefore, embodiments of the present disclosure also refers to a probe card for a testing apparatus of electronic devices, the probe card comprising at least one probe head 20 according to the present disclosure, the space transformer 29 adapted to perform a spatial transformation of the distances between the contact pads 30 formed on the face thereof facing the probe head 20, and/or a PCB adapted to interface said probe card with the testing apparatus.

In conclusion, the present disclosure provides a vertical probe head provided with guides configured such that the scrub of each contact probe is substantially eliminated. In particular, a pair of lower guides is provided, said guides having guide holes shifted with respect to each other, as well as a further lower guide whose guide holes have a suitably calibrated shift with respect to the shift between the guide holes of the other two lower guides, in order to cancel each scrub movement, so that the shear forces exerted by the contact probes are entirely absorbed by said further lower guide.

Advantageously according to the present disclosure, the scrub movement of the contact tips of each probe is substantially cancelled, the lateral forces being discharged onto the lower guide that is the closest to the device under test. In this way, suitably, the overall transversal or shear load exerted by said contact probes on a device under test and on the semiconductor wafer comprising it is substantially null, namely the force exerted by the probe head parallel to a face of the device under test facing the probe head is substantially null. This allows a more precise and reliable test and avoids phenomena such as the lateral shift of the semiconductor wafer due to not compensated lateral forces (shear forces) of the contact probes, as it instead occurs in the known solutions.

Moreover, thanks to the fact that the scrub of the tips of each contact probe is substantially null, the possibility of damaging the probes and the contact pads during the contact of the probe head with the device under test is eliminated.

Finally, it is noted that, thanks to the adopted configuration, undesired contacts between probes that are close to each other are avoided, while the bending of the probes is in any case always allowed.

It is thus clear that the disclosed probe head effectively solves the problems of the prior art, allowing an improved test, especially in case of numerous contact probes.

From the foregoing it will be appreciated that, although specific embodiments of the disclosure have been described herein for purposes of illustration, various modifications may be made without deviating from the spirit and scope of the disclosure, all included in the protection scope as defined by the appended claims.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A probe head for testing a device under test integrated on a semiconductor wafer, comprising:
   a plurality of contact probes, each having a first end and a second end, the first end being configured to contact pads of the device under test;
   at least one first lower guide and one second lower guide at the first end of the probes, said first and second lower guides being parallel to each other and having a respective plurality of first and second guide holes for slidingly housing the contact probes, wherein the second guide holes of the second lower guide are shifted with respect to the first guide holes of the first lower guide along a first direction; and
   at least one third lower guide, which is substantially parallel to the first lower guide and to the second lower guide and includes a plurality of third guide holes for slidingly housing the contact probes,
   wherein the second lower guide is arranged between the first lower guide and the third lower guide, and wherein the third guide holes of the third lower guide are shifted with respect to the second guide holes of the second lower guide along a second direction opposite the first direction, the shift of the third guide holes being configured to eliminate a scrub movement of the first ends of each contact probe of the probe head.

2. The probe head according to claim 1, wherein the second guide holes have a shift with respect to the first guide holes along the first direction within a range of 5 µm to 30 µm, inclusive, and wherein the third guide holes have a shift with respect to the second guide holes along the second direction within a range of 5 µm to 30 µm.

3. The probe head according to claim 1, comprising at least one first upper guide, which is arranged at the second end of the contact probes and is parallel to said first, second and third lower guides, the first upper guide including a plurality of guide holes for slidingly housing the contact probes.

4. The probe head according to claim 3, further comprising a second upper guide associated with the first upper guide, the second upper guide including guide holes that are shifted with respect to the guide holes of the first upper guide.

5. The probe head according to claim 4, wherein the first and second upper guides and the first, second and third lower guides are mutually shifted to cause said shift between the first end and the second end of the contact probes.

6. The probe head according to claim 1, wherein each contact probe includes a body extending along a longitudinal axis between the first end and the second end.

7. The probe head according to claim 6, wherein the first end of all the contact probes is shifted with respect to the second end according to a specific direction, said shift being measured with reference to the longitudinal axis of the contact probes.

8. The probe head according to claim 1, wherein at least one wall of the contact probes is configured to contact a corresponding wall of the third guide holes of the third lower guide, which is configured to counteract a transversal force exerted by the contact probes.

9. The probe head according to claim 1, wherein the third lower guide is arranged to be the closest guide to the device under test during the test thereof.

10. A probe card for a test equipment of electronic devices, comprising:
   at least one probe head, the at least one probe head including:
   a plurality of contact probes, each having a first end and a second end, the first end being configured to contact pads of the device under test;
   at least one first lower guide and one second lower guide at the first end of the probes, said first and second lower guides being parallel to each other and having a respective plurality of first and second guide holes for slidingly housing the contact probes, wherein the second guide holes of the second lower guide are shifted with respect to the first guide holes of the first lower guide along a first direction; and
   at least one third lower guide, which is substantially parallel to the first lower guide and to the second lower guide and includes a plurality of third guide holes for slidingly housing the contact probes,
   wherein the second lower guide is arranged between the first lower guide and the third lower guide, and wherein the third guide holes of the third lower guide are shifted with respect to the second guide holes of the second lower guide along a second direction opposite the first direction, the shift of the third guide holes being configured to eliminate a scrub movement of the first ends of each contact probe of the probe head;
   a space transformer configured to perform a spatial transformation of the distances between contact pads made on a face thereof facing the probe head, or a printed circuit board configured to interface the probe card with the test equipment.

* * * * *